*INVENTOR*
CHARLES A. WALTON

BY Otto Schmid, Jr.
ATTORNEY

United States Patent Office 3,566,397

Patented Feb. 23, 1971

3,566,397

DUAL SLOPE ANALOG TO DIGITAL CONVERTER

Charles A. Walton, Los Gatos, Calif., assignor to International Business Machines Corporation, Armonk, N.Y., a corporation of New York Filed Jan. 15, 1969, Ser. No. 791,218
Int. Cl. H03k 13/20
U.S. Cl. 340—347 12 Claims

ABSTRACT OF THE DISCLOSURE

An analog to digital converter is shown wherein an amplifier is connected in the converter circuit to perform both functions of amplification and integration as well as providing a high input impedance. The converter input is shorted while drift voltages due to the amplifier integrator are compensated by amplifying the drift voltage and utilizing the amplified value as drift compensation by feedback to the input. An unknown voltage signal is next coupled to the potentiometric feedback connected amplifier and the input signal is integrated for a predetermined time. A reference voltage of like sign to the unknown analog signal is then integrated while the amplifier is connected as an inverting integrator. The time that is necessary for the integrator output voltage to reach its initial zero level is measured by a digital representation generating means such as a counter and yields a digital representation of the input analog signal.

BACKGROUND OF THE INVENTION

This invention relates to analog to digital converters and more particularly to an integrating ramp analog to digital converter wherein a single amplifier is utilized in the converter circuit to perform both functions of amplification and integraton as well as providing a high input impedance.

There are many applications which require the conversion of an analog signal to digital form, and in many of these applications, a plurality of analog signals is present representing a wide dynamic range in signal amplitude. To obtain precision in conversion over the dynamic range of the sgnals in prior art converters, it has been necessary to provide a multi-range capability usually by including a gain changing amplifier. To prevent loading of the analog signal sources, it is also necessary for the amplifier to have a high input impedance. The prior art converters suitable for such use are generally expensive due to the complex circuits required. Prior art successive approximation type analog to digital converters offer high conversion speed and high precision operation. However, they use many components and are generally expensive. The prior art integrating ramp converters provide low cost for the precision obtained as well as the capability of readily producing a tradeoff of speed versus resolution. In addition, these converters provide error cancellation and less sensitivity to noise. The dual integrating ramp converters require an active integrator, which is an inverting operational amplifier connected with resistance input and capacitance feedback to form an active integrator, and the system input impedance is limited to the input resistor value, which is too low for a large number of applications. This converter is thus necessarily preceded by a separate precision performance amplifier.

There is described herein an improved integrating ramp analog to digital converter which produces all the advantages of prior art dual integrating ramp ADC's, but which uses only one amplifier to produce both the amplification and the integration functions in a system utilizing a plurality of analog signals representing a wide dynamic range in signal amplitude.

It is, therefore, an object of this invention to provide an improved analog to digital converter of the integrating ramp type having precision of conversion for input signals over a wide dynamic range.

It is another object of this invention to provide an analog to digital converter having all the advantages of the above mentioned prior art converters, but which requires only a single amplifier.

SUMMARY OF THE INVENTION

Briefly, according to the invention there is provided an integrating ramp analog to digital converter wherein one of a plurality of unknown analog input signals is coupled to an amplifier and impedance means coupled to form a non-inverting feedback integrator to integrate the input voltage for a predetermined time. Switching means are then actuated for coupling the amplifier and the impedance means to form an inverting feedback integrator. A referenre voltage source of like polarity to the unknown input voltage is then coupled to the integrator and integrated until the integrator output voltage reaches its initial level, at which time a digital representation of the unkown analog signal is in a digital representation generating means.

The above described operation is provided according to a specific embodiment of the invention by providing an amplifying means having an inverting input terminal, a non-inverting input terminal and an output terminal. A source of unknown analog voltage is selectively coupled to the non-inverting input terminal of the amplifying means. A capacitive and a resistive impedance element are coupled from the output terminal of the amplifying means to a reference potential such as ground potential, and a feedback connection from the junction between the impedance elements to the inverting input terminal is provided to form a non-inverting feedback integrator. The integrator functions to integrate the unknown signal coupled to the positive or non-inverting input of the amplifier and provides at the output terminal a signal which represents the time integral of the input signal. The input signal is integrated for a predetermined time which is established by a means for generating digital representation signals. The integration of the unknown signal is then interrupted by connecting the non-inverting terminal of the amplifying means to the reference potential and coupling the impedance element to form an inverting feedback integrator. A control means is provided to generate signals operative to couple a reference voltage source of like polarity to the unknown signal through the resistive impedance element to the inverting input terminal of the amplifying means. The reference voltage is then integrated until the integrator output voltage reaches its initial level, while the means for generating digital representation signals is operated at the same rate as during the unknown signal integration. A digital representation of the unknown analog signal is in the means for generating digital representations when it is sensed that the integrator output voltage has reached its initial level, at which time the conversion cycle is ended.

The foregoing and other objects, features and advantages of the invention will be apparent from the following more particular description of a preferred embodiment of the invention as illustrated in the accompanying drawings.

DESCRIPTION OF PREFERRED EMBODIMENTS

Figure 1:
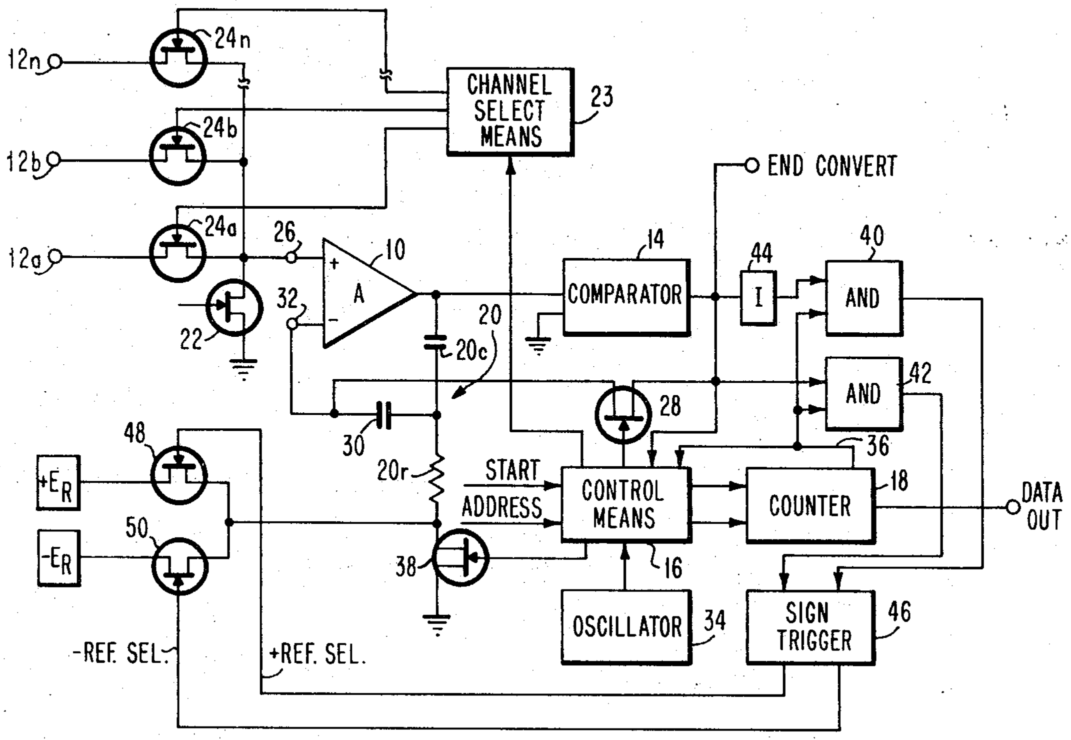
FIG. 1 is a schematic block diagram of a dual ramp integrating analog to digital converter embodying the invention.

A dual integrating ramp type analog to digital converter (ADC) is shown in the drawings.

In dual integrating ramp ADC's an unknown analog voltage is integrated for a fixed period of time. A reference voltage of like polarity is then integrated until the output voltage of the integrator returns to its initial level. During integration of the reference voltage, clock pulses are gated into a counter thereby giving a digital representation of the analog signals magnitude. Certain technical advantages possessed by dual integrating ramp ADC's are known in the art. These advantages are produced to an extent by the fact that the upward and downward integration of the signal causes some of the factors which produce errors in other types of ADC's to cancel and thereby be eliminated as error-causing factors. One of these factors is the RC coefficient in the integrator circuit, and another factor is the clock frequency, since long term drift in the clock circuitry will not introduce any operating errors to the converter. In addition, drift in the comparator circuit, as well as the comparator circuit time delay, does not produce any operating errors in the converter. The result of this operation is that the linearity of the converter as a whole becomes better than that of the integrator circuit itself.

For the integration of the unknown signal a non-inverting feedback integrator is utilized. In a non-inverting feedback integrator, the input signal $e_1$ is coupled to the non-inverting terminal of an amplifier and the output voltage $E_0$ is produced at the output terminal of the amplifier. A capacitive impedance C is coupled between the output terminal of the amplifier and the inverting input terminal of the amplifier to provide a feedback connection. A resistive impedance R is coupled from the inverting input terminal of the amplifier to a reference potential which is ground potential in the embodiment shown. It can be shown that the output voltage $E_0=e_1(1+t/RC)$. This equation shows that the output voltage takes an initial step on application of the input voltage and a ramp voltage determined by the time $t$ and the time constant RC results after the initial step. This integrator has the advantage of a high input impedance; however, this type of integrator has not previously been used for dual integrating ramp ADC's partly due to difficulty in accommodating the initial step at the start of an integrating operation.

An inverting feedback integrator is utilized for the reference signal integration operation. A conventional inverting feedback integrator comprises an input signal $e_1$ which is coupled through a resistive impedance R to the inverting input terminal of an amplifier. The output signal $E_0$ is produced at the output terminal of the amplifier and a capacitive impedance C is coupled from the output terminal of the amplifier to the same inverting input terminal of the amplifier to provide a feedback path. The non-inverting input terminal of the amplifier is coupled to a reference potential such as ground potential. It can be shown that the output voltage $$E_0=e_1t/RC$$

This output represents a linearly increasing ramp with time $t$ with the slope determined by the time constant RC. It has been recognized that the inverting feedback integrator is suitable for use in a dual integrating ramp ADC although the integrator has a disadvantage since the input impedance equals R. This input impedance is too low for most applications, which means that there must be a prior amplifier and the other parts of the circuit must be more complex to compensate for this factor.

My invention provides a dual integrating ramp ADC which utilizes the non-inverting form of feedback integrator during the integration of the unknown input signals where the high input impedance is essential to prevent unduly loading the input signal channels during a conversion operation. The use of this form of integrator is made possible by coupling the non-inverting terminal of the amplifier to the reference potential such as ground potential at the end of the unknown signal integration. This action is equivalent to introducing an input signal at that time of $-e_1$ which produces at the output terminal a step signal $-e_1$ which cancels the original step and thereby eliminates the step from the effective output of the amplifier at this time. The impedance elements R and C are then switched to provide an inverting feedback integrator for integration of the reference voltage $E_R$ since the reference voltage source can be designed to operate compatibly with the input impedance R of the integrator. In this manner, an ADC is produced having the accuracy of prior art ADCs, but which has a greatly reduced cost due to the requirement for only one amplifier in the system rather than the two previously required.

Referring particularly to FIG. 1, in this ADC an amplifying means 10 is provided to receive a signal from one of the unknown analog voltage sources 12*a*, 12*b* . . . 12*n* and comparator 14 is provided to sense the output of amplifier 10. Control means 16 is provided to generate proper control signals for the operation of the ADC. A means for generating digital representations is also provided. Impedance means 20 is provided to control the configuration of the circuit utilizing amplifying means 10. In the embodiment shown, impedance means 20 comprises a capacitive impedance means 20*c* and a resistive impedance means 20*r*. Switch 38 is provided to selectively connect one end of resistor 20*r* to ground potential.

An ADC conversion operation is commenced by a START signal (at time $t_2$ in FIG. 2) which may be supplied by an external control device such as an associated processor of a data processing system for example. At the start of or prior to a conversion operation a zero-correct cycle (time $t_1$ to $t_2$ in FIG. 2) may be initiated if desired by coupling the non-inverting input terminal 26 of amplifying means 10 to a suitable initial value such as ground potential by gating means 22. Any drift voltage present in the circuit including amplifying means 10 and comparator means 14 is integrated and appears at the output of comparator means 14. This value is coupled by means of drift correct switching means 28 to zero correct capacitor means 30. Capacitor 30 stores a charge representing the time integral of the drift value to remove this value from the conversion operation, and capacitor 30 has a relatively large value so that its voltage does not change appreciably between times $t_2$ and $t_4$. Although the zero correct cycle is shown as being performed from time $t_1$ to $t_2$ in FIG. 2, this cycle could as well be performed after the conversion and the actual timing of a zero correct cycle when used will be recognized as a matter of choice.

Upon completion of the drift elimination process in the embodiment shown, gating means 22 is turned ON and one of gating means 24$a$, 24$b$ . . . 24$n$ is turned ON to couple the unknown input signal from the selected channel to non-inverting input terminal 26 of amplifying means 10. Selection of the analog input signal is accomplished by a signal derived from an ADDRESS signal which is supplied from the external control device. The ADDRESS signal is coupled to control means 16 and utilized to control channel select means 23 for generation of the selection signal. Generally the START and ADDRESS signals are supplied at the same time which is time $t_2$ in FIG. 2. The ADDRESS signal may be received earlier if desired and temporarily stored until its use at time $t_2$.

Figure 2:
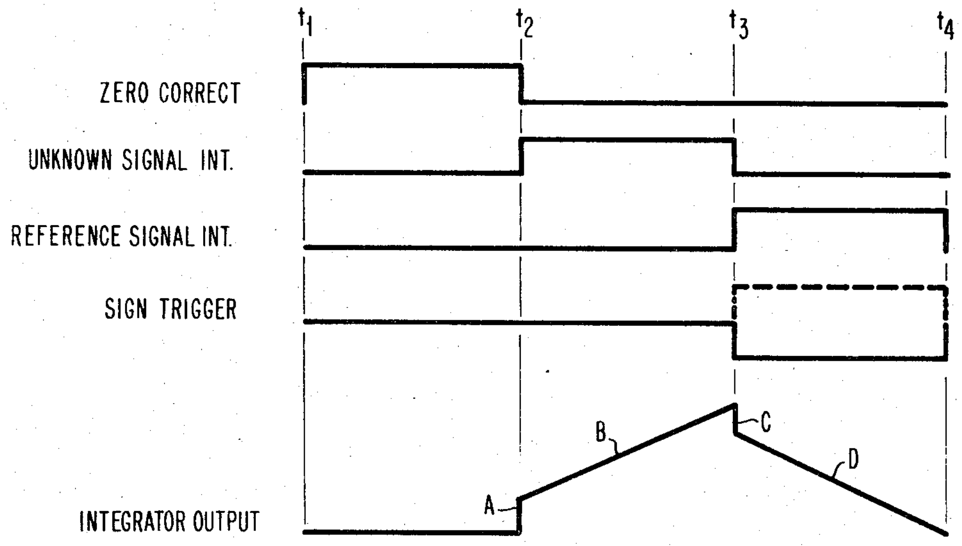
FIG. 2 is a voltage-time diagram showing the signals generated by the ADC circuits of FIGS. 1 and 3.

Switch 38 is turned ON to connect one end of resistor 20$r$ to ground potential thereby completing the coupling of the circuit elements to produce a non-inverting feedback integrator. Amplification and integration of the selected input signal is effected due to the connection of impedance means 20 in a feedback path to the inverting input terminal 32 of amplifying means 10. At the start of the integration a step voltage shown as step A in FIG. 2 is produced at the integration output and this is followed by a ramp output voltage shown as ramp B in FIG. 2. Simultaneously with the beginning of integration of the unknown signal, there is started a digital representation generating means comprising oscillator 34 feeding pulses through control means 16 to step counter 18. The count in counter 18 begins at zero at the start of the integration and continues at a rate determined by oscillator 34 as the unknown signal is being integrated. When counter 18 reaches its capacity an overflow signal is generated on line 36 and this signal is coupled to control means 16 to signify that the integration of the unknown analog signal has proceeded for the predetermined time required to fill counter 18.

At this time ($t_3$ in FIG. 2) control means 16 is operable to deactivate the selected gate 24 to stop the integration of the unknown signal. At the same time, a signal from control means 16 closes gate 22 so that the input voltage is essentially a negative step function of the same magnitude as the unknown analog voltage signal to produce the negative step C as shown in FIG. 2. This step C cancels the effect of step A produced at the start of the unknown analog signal integration cycle and thereby effectively removes these steps as factors in the conversion. Gate 38 is opened and a reference voltage of the same polarity as the unknown input voltage is coupled to the inverting input terminal 32 of amplifier 10. The polarity of the comparator output is sensed at the time counter 18 reaches capacity (at $t_3$ in FIG. 2) by AND circuits 40, 42, and inverter 44 and sign trigger 46 is set to the appropriate state. Signals from sign trigger 46 output are utilized to select a positive reference voltage source $+E_R$ by gating means 48 or a negative reference voltage source $-E_R$ by gating means 50. Integration of the selected reference voltage continues as the counter is stepped at the same rate as before to produce ramp voltage D in FIG. 2 until comparator means 14 senses that the output voltage of amplifier 10 reaches the initial or reference level. In the embodiment shown the reference or initial level is essentially ground potential. When the output voltage of amplifier 10 reaches the initial level a signal is coupled to control means 16 to stop integration of the reference voltage. At this time ($t_4$ in FIG. 2) the gating of oscillator pulses to step counter 18 is also stopped and the count in the counter at this time is a digital representation of the unknown analog voltage. A signal END CONVERT is available for use by a utilization device and the digital data can be gated from counter 18 to the utilization device.

Figure 3:
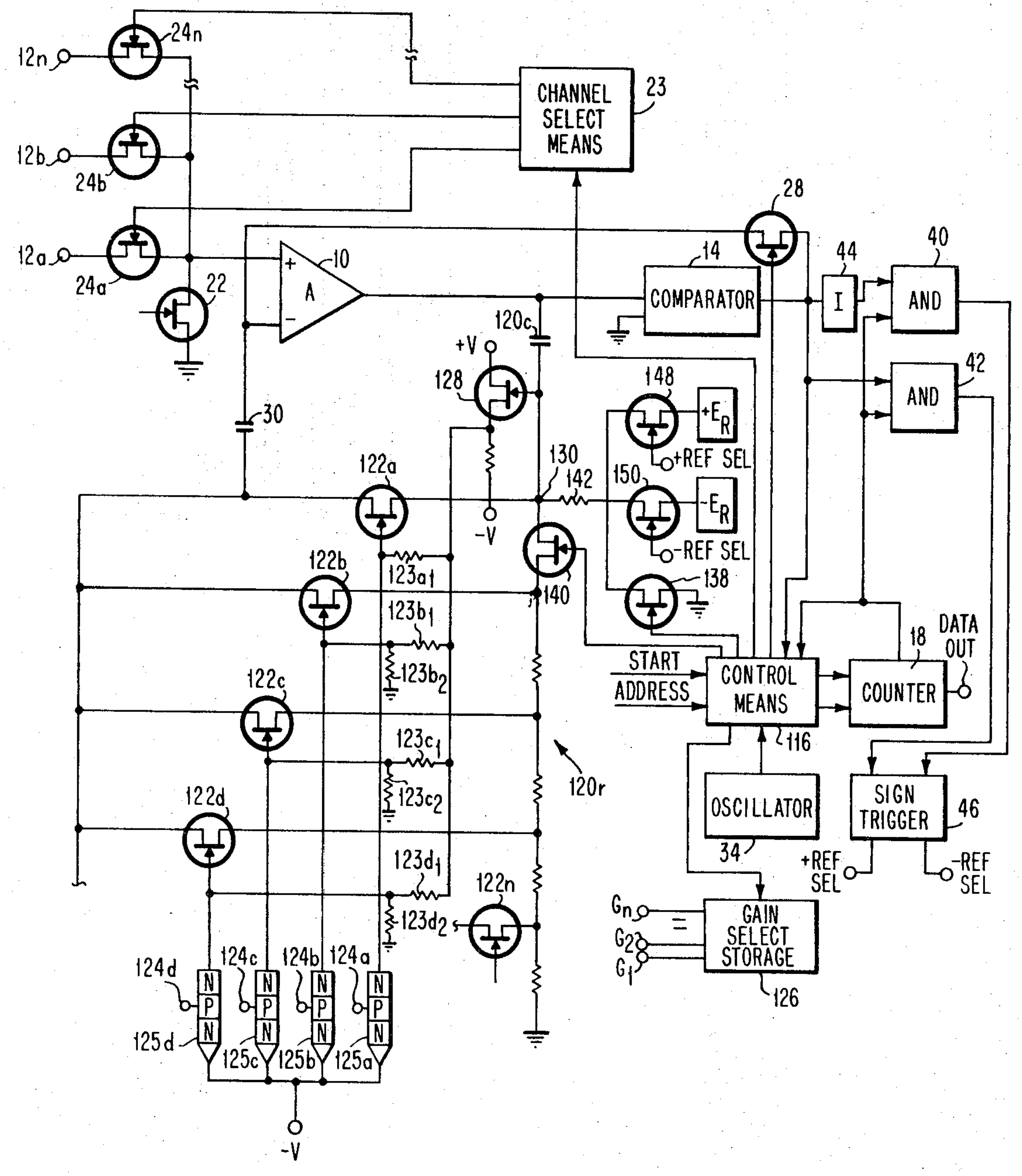
FIG. 3 is a schematic block diagram of a dual ramp integrating analog to digital converter which includes a gain select control circuit.

A specific embodiment of the invention is shown in FIG. 3 wherein a gain select feature is added to the circuit shown in FIG. 1. In this embodiment of the invention amplifier 10 is provided to receive a signal from unknown analog voltage source 12$a$, 12$b$ . . . 12$n$ and a comparator 14 is provided to sense the output of amplifier 10. Control means 116 is provided to generate proper control signals for the operation of the ADC. A means for generating digital representations 18 is also provided. Impedance means 120$r$ and 120$c$ are provided to control the configuration of the circuit utilizing amplifying means 10. A plurality of gain select switching means 122$a$, 122$b$, 122$c$, 122$d$ . . . 122$n$ is provided for selecting the gain of amplifier 10 based on the projected amplitude of the unknown analog signal. The gain select signals are provided by any suitable source such as a controlling data processing machine, for example.

In the embodiment of the invention shown in the drawings a gain select storage means 126 is provided. This storage means stores the gain factor for each of the input signal sources 12$a$, 12$b$ . . . 12$n$ based on the magnitude of signal to be expected from that particular input source device. The gain factors are then chosen on the basis of the address information signals supplied by control means 116. If desired, storage means 126 may comprise a part of the storage of an associated data processing machine. The selection of the gain factor is accomplished by a selected one of signals G1, G2 . . . G$n$ to terminals 124$a$, 124$b$, 124$c$, 124$d$ at the base of associated bipolar transistors 125$a$, 125$b$, 125$c$, 125$d$. The signals G1, G2 . . . G$n$ are operative to turn off the associated bipolar transistor so that the associated switching means 122$a$, 122$b$, 122$c$, 122$d$ is turned on. To turn on switching means 122 in the embodiment shown wherein each switching means comprises a junction field effect transistor, the gate terminal must be held within a few tenths of a volt of the source and drain to hold the FET ON and held at minus four volts or greater from the source and drain to hold the transistor OFF. Since switching means 122 are in the feedback path of amplifier 10, a more reliable operation results if the gate control voltages are permitted to follow the amplifier output voltage which in a typical case may vary ± five volts. This is accomplished in the embodiment shown by coupling source follower means 128 to the junction 130 between the capacitive impedance element 120$c$ and the resistive impedance element 120$r$. The gate voltages are then controlled by low accuracy resistors 123$a_1$, 123$b_1$, $b_2$, 123$c_1$ $c_2$ 123$d_1$, $d_2$ having a ratio approximately equal to the feedback ratio which is being selected. These resistors 123 are coupled with one resistor returned to the amplifier output and one returned to ground. The result of this circuit is that when ON, the gate voltage is always within a few tenths of a volt of the drain voltage no matter how the amplifier output varies. This circuit constitutes a load on the source follower output. However, the value of resistors 123 is made large which causes the error due to this additional load to be negligibly small.

A conversion operation utilizing the gain select embodiment may be started as before with a zero-correct cycle if desired. This operation is accomplished by turning ON gating means 22, zero select gating means 28 and gating means 140. The drift voltage throughout the circuit is integrated as before and the drift-correct value is stored in capacitor means 30. Capacitor means 30 is a large value so that the stored value does not change appreciably during the ensuing conversion cycle.

Just prior to the start of the unknown signal integration, a gain factor is selected. In the embodiment shown this factor is read out of gain select storage means 126 by START and ADDRESS signals which are supplied simultaneously by control means 116 to both storage means 126 and channel select means 23. Gain factor signals are then utilized to select the appropriate switching means 122. Switching means 122$a$ is provided for a gain of one or unity and in this case the appropriate channel select means 24, switching means **122*a* and switching means 138 are ON and switching means 140 OFF. Switching means 138 couples resistive impedance element 142** into the circuit. Integration of the unknown input signal then proceeds as previously described, the sign of the output is sensed and the appropriate reference signal integration proceeds as before.

In the event that a gain factor greater than one is selected, the appropriate switching means **122*b*, 122*c* or 122*d* is selected. The selection of this switching means utilizes a part of precision resistor string 120*r* in the feedback path of amplifier 10. The relative values of the resistors comprising resistive impedance means 120*r* establish system feedback and hence system gain. For selection of a non-unity gain switching means 140 is ON along with the appropriate switch 122 and switch 138** is OFF. The selection is made at the start of the unknown signal integration and remains selected through the reference signal integration so that the same resistors are in the feedback path for both unknown and reference signal integration to thereby eliminate a potential source of error.

When a system is required to operate over an input range of plus or minus several volts with a microvolt error requirement, the input gating including transistors 22, 24 for amplifier 10 requires greater than average care in circuit design. In this case a resistor of large value, such as 22 megohms, for example, is coupled between gate and source of the gating transistor 24 to ensure that the gating transistor stays on in spite of any signal variations. However, the addition of this resistor produces an unbalanced input current when the gating transistor is off. For this reason, a second large value resistor is provided between the source of transistor 24 and gate of transistor 22 to produce a complementary current during non-amplify time only.

While the invention has been particularly shown and described with reference to a preferred embodiment thereof, it will be understood by those skilled in the art that various changes in the form and details may be made therein without departing from the spirit and scope of the invention.

What is claimed is:

1. An analog to digital converter for producing a digital representation of the magnitude of an analog signal of unknown magnitude comprising:

an amplifier having an inverting input terminal, a non-inverting input terminal and an output terminal;
a feedback impedance means;
means for selectively coupling said amplifier and said impedance means to form a non-inverting feedback integrator;
means for coupling a source of analog signals of unknown magnitude to said non-inverting terminal of said amplifier for a predetermined time to integrate said unknown signal;
means for selectively coupling said amplifier and said impedance means to form an inverting integrator;
means for coupling a reference signal of the same polarity as said unknown analog signal to said inverting terminal of said amplifier to integrate said reference signal until the output of said amplifier reaches its initial level; and
means responsive to said integrating means for generating said digital representation of said analog signal.

2. The analog to digital converter according to claim 1 additionally comprising means for storing a voltage representative of the drift voltage in said converter prior to the start of a conversion cycle.

3. The analog to digital converter according to claim 1 additionally comprising means for selectively varying said feedback impedance means to select a system gain.

4. An analog to digital converter for producing a digital signal proportional to the magnitude of an unknown analog signal comprising:

an amplifier having an inverting input terminal, a non-inverting input terminal and an output terminal;
a first and a second impedance element;
a source of unknown analog signals;
means for coupling said amplifier and said impedance elements to form a non-inverting feedback integrator;
means for coupling said source of unknown analog signals to said non-inverting terminal of said amplifier;
means for generating digital representations;
control means for integrating said unknown signal while operating said means for generating digital representations for a predetermined time;
a reference voltage source of the same polarity as said unknown analog signal;
means for coupling said amplifier and said impedance elements to form an inverting integrator;
means for coupling said reference voltage source to said inverting terminal of said amplifier to integrate said reference voltage; and
means for sensing when the output of said amplifier reaches its initial level, whereby a digital representation of said unknown analog signal is then in said means for generating digital representations.

5. The analog to digital converter according to claim 4 additionally comprising means for storing a voltage representative of the drift voltage in said converter prior to the start of a conversion cycle.

6. The analog to digital converter according to claim 4 additionally comprising means for selectively varying said second impedance element to select a system gain.

7. An analog to digital converter for producing a digital signal proportional to the magnitude of an unknown analog signal comprising:

an amplifier having an inverting input terminal, a non-inverting input terminal and an output terminal;
a feedback impedance means comprising a capacitive impedance means and a first and a second resistive impedance means;
a source of analog signals of unknown magnitude;
means for selecting a predetermined ratio of said first resistive impedance means to said second resistive impedance means to select a system gain;
means for selectively coupling said amplifier and said impedance means to form a non-inverting feedback integrator;
means for coupling the analog signal to said non-inverting terminal of said amplifier for a predetermined time to integrate said analog signal;
means for selectively coupling said amplifier and said impedance means to form an inverting integrator;
means for coupling a reference signal of the same polarity as said analog signal to said inverting terminal of said amplifier to integrate said reference signal until the output of said amplifier reaches its initial level; and
means responsive to said integrating means for generating said digital representation of said analog signal.

8. The analog to digital converter according to claim 7 wherein a plurality of analog signal sources is present and wherein a predetermined one of said analog signal sources is selected by said means for selecting a predetermined ratio of said resistive impedance means.

9. The analog to digital converter according to claim 8 wherein said first and said second resistive means comprises a plurality of resistive elements coupled between said capacitive impedance means and a reference potential.

10. The analog to digital converter according to claim 9 wherein said means for selecting a predetermined ratio of said first and said second impedance means comprises:

a plurality of switching means;
means for coupling each of said switching means from a predetermined one of said resistive means to the inverting input terminal of said amplifier.

11. The analog to digital converter according to claim 10 wherein said switching means comprises a transistor; and a control circuit for each of said transistors comprising resistive divider means coupled to the output of said amplifier.

12. The analog to digital converter according to claim 11 wherein said resistive divider means has a divider ratio approximately the same as the gain ratio selected by the corresponding switching means.

References Cited

UNITED STATES PATENTS

| | | | |
|---|---|---|---|
| 2,994,825 | 8/1961 | Anderson | 328—189 |
| 3,051,939 | 8/1962 | Gilbert | 340—347 |

| | | | |
|---|---|---|---|
| 3,316,547 | 4/1967 | Ammann | 340—347 |
| 3,445,839 | 5/1969 | Engelberg et al. | 340—347 |
| 3,462,758 | 8/1969 | Reynal et al. | 340—347 |
| 3,500,384 | 3/1970 | Naydan et al. | 340—347 |

MAYNARD R. WILBUR, Primary Examiner

G. R. EDWARDS, Assistant Examiner

U.S. Cl. X.R.

324—99